(12) United States Patent
Cao

(10) Patent No.: US 12,034,413 B2
(45) Date of Patent: Jul. 9, 2024

(54) DUAL-MODE POWER AMPLIFIER WITH SWITCHABLE OPERATING FREQUENCIES

(71) Applicant: Xiumei Cao, Guangdong (CN)

(72) Inventor: Xiumei Cao, Guangdong (CN)

(*) Notice: Subject to any disclaimer, the term of this patent is extended or adjusted under 35 U.S.C. 154(b) by 497 days.

(21) Appl. No.: 17/425,318

(22) PCT Filed: Mar. 28, 2019

(86) PCT No.: PCT/CN2019/080124
§ 371 (c)(1),
(2) Date: Jul. 22, 2021

(87) PCT Pub. No.: WO2020/151081
PCT Pub. Date: Jul. 30, 2020

(65) Prior Publication Data
US 2022/0085770 A1    Mar. 17, 2022

(30) Foreign Application Priority Data

Jan. 23, 2019 (CN) .......................... 201910060888.0

(51) Int. Cl.
*H03F 1/56* (2006.01)
*H03F 3/19* (2006.01)
*H03F 3/21* (2006.01)

(52) U.S. Cl.
CPC ................ *H03F 1/56* (2013.01); *H03F 3/19* (2013.01); *H03F 3/211* (2013.01);
(Continued)

(58) Field of Classification Search
CPC ... H03F 1/56; H03F 3/19; H03F 3/211; H03F 2200/387; H03F 2200/451;
(Continued)

(56) References Cited

U.S. PATENT DOCUMENTS

2017/0149394 A1* 5/2017 Kao ..................... H03F 3/45076

FOREIGN PATENT DOCUMENTS

| CN | 1303536 A | 7/2001 |
| CN | 106533374 A | 3/2017 |
| CN | 109104159 A | 12/2018 |

OTHER PUBLICATIONS

International Search Report of PCT Patent Application No. PCT/CN2019/080124 issued on Jul. 26, 2019.

* cited by examiner

*Primary Examiner* — Andrea Lindgren Baltzell
*Assistant Examiner* — Khiem D Nguyen

(57) ABSTRACT

Provided is a dual-mode power amplifier with switchable operating frequencies, comprising at least two preamplifier circuits, a matching circuit for matching an output signal of each preamplifier circuit, an input transformer T1 with at least two output taps, an output stage amplifier circuit with the same number as the output taps of the input transformer T1, an output transformer T2, a switch S1 and a switch S2; circuit power supply VCC1 is loaded on an input end of the input transformer T1 via switch S1 and switch S2 respectively; operating frequencies of the matching circuit are different. The power amplifier realizes the switching of the maximum output power, supports the signal amplification in more frequency bands, and solves the problems in the prior art that the number of components is too large because more groups of power amplifiers for power amplification are needed for different frequency bands.

11 Claims, 6 Drawing Sheets

(52) U.S. Cl.
CPC .. *H03F 2200/387* (2013.01); *H03F 2200/451* (2013.01); *H03F 2203/21139* (2013.01)

(58) Field of Classification Search
CPC ...... H03F 2203/21139; H03F 2200/111; H03F 2200/537; H03F 2203/7209; H03F 3/72
USPC .......................................... 330/126, 188, 195
See application file for complete search history.

DUAL-MODE POWER AMPLIFIER WITH SWITCHABLE OPERATING FREQUENCIES

TECHNICAL FIELD

The invention relates to a power amplifier, in particular to a dual-mode power amplifier with switchable working frequencies.

BACKGROUND

Power amplifier is a device that is capable of amplifying the voltage or power of input signal, which is composed of electronic tube or transistor, power transformer and other electronic components. It is widely used in communication, broadcasting, radar, television, automatic control and other devices.

The operating frequency of power amplifier is determined by the stages of matching networks. The stage of matching network of the conventional power amplifier is fixed, so the operating frequency of a group of power amplifiers is also fixed. For example, for the cellular data RF front-end of mobile phone, its power amplifier system is expected to support high frequency band, medium frequency band and low frequency band at present, and more frequency bands need to be supported as the technology evolves. The current solution is to prepare different groups of power amplifiers for high frequency, medium frequency and low frequency, which leads to high cost, large number of components, difficult integration and difficult design.

SUMMARY OF THE INVENTION

In order to solve the problems existing in the prior art, the purpose of the present invention is to provide a dual-mode power amplifier which is capable of realizing the switching of operating frequency, supporting the signal amplification in a wider frequency band, and solving the problems of large number of components, difficulty in integration and difficulty in design caused by setting multiple groups of power amplifiers for power amplification in different frequency bands in the prior art.

To realize the purpose of the present invention, a dual-mode power amplifier with switchable operating frequencies is provided, including at least two preamplifier circuits, a matching circuit for matching an output signal of each preamplifier circuit, an input transformer T1 with at least two output taps, an output stage amplifier circuit with the same number as the output taps of the input transformer T1, an output transformer T2, a switch S1 and a switch S2; and circuit power supply VCC1 is loaded on an input end of the input transformer T1 via the switch S1 and the switch S2 respectively; operating frequencies of the matching circuit are different.

Furthermore, the matching circuit includes a capacitor C1 connected between an output end of the preamplifier circuit and ground.

Furthermore, the matching circuit includes a capacitor C1 and an inductor L5 connected in series between an output end of the preamplifier circuit and ground.

Furthermore, the matching circuit includes a capacitor C1, a capacitor C2 and an inductor L5; the capacitor C1 is connected between an output end of the preamplifier circuit and ground, and the capacitor C2 and the inductor L5 are connected in series between an output end of the preamplifier circuit and ground.

Furthermore, the end of the switch S1 and/or the switch S2 connected to circuit power supply VCC1 is further grounded via a capacitor C6/capacitor C15.

Furthermore, the dual-mode power amplifier with switchable operating frequencies includes an input matching circuit for performing input matching on a signal loaded on an input end of each preamplifier circuit.

Furthermore, the dual-mode power amplifier with switchable operating frequencies includes an output matching circuit for performing output matching on an output signal of the output transformer T2.

Furthermore, the dual-mode power amplifier with switchable operating frequencies includes a switch group composed of at least two switches connected with an output end of the output matching circuit, and each switch is an independent output for outputting signals.

Furthermore, the dual-mode power amplifier with switchable operating frequencies includes a switchable capacitor array, the switchable capacitor array is connected to an input end of the output transformer T2 to establish matching; and the switchable capacitor array includes an impedance element and a controllable switch element whose on/off is controlled by an external control signal to form different impedances.

Furthermore, the preamplifier circuit and the output stage amplifier circuit are controlled to be turned on/off by a bias circuit.

Furthermore, one or more of the preamplifier circuit, the matching circuit, the input transformer T1, the output stage amplifier circuit, the output transformer T2, the switch S1, the switch S2, the input matching circuit, the bias circuit, the output matching circuit and the switchable capacitor array are integrated on one chip, and other circuits are integrated on another chip or distributed independently.

The beneficial effects of the invention include:
1. The power amplifier of the invention is provided with at least two preamplifier circuits, and a matching circuit for matching an output signal, and the matching circuit have different operating frequencies. According to the different signal frequencies received by the preamplifier circuit, a preamplifier circuit is selected and turned on, and the switch S1/switch S2 is turned on, so that the preload line is turned on, thereby realizing the switching of operating frequency, supporting signal amplification of more frequency bands, and solving the problems of large number of components, difficult integration and difficult design caused by setting multiple groups of power amplifiers for power amplification in different frequency bands in the prior art. The dual-mode power amplifier can be used for high frequency/medium frequency/low frequency, which reduces the cost, the number of components, and the design difficulty, and is easy to be integrated. The wide-band amplifier is realized, the number of components and material cost are reduced, and the system integration degree of the power amplifier is increased.
2. The dual-mode power amplifier provided by the invention also includes a switch group consisting of at least two switches, so that one or more outputs are realized, and the output controllability of the output matching circuit provided by the invention is further improved.
3. The dual-mode power amplifier provided by the invention also includes a switchable capacitor array consisting of an impedance element and a controllable switch element whose on/off is controlled by an external control signal. The control signal controls the on/off of the controllable switch element, which realizes the reconstruction of the output stage matching circuit and the switching of the output operating frequency band.

4. One or more of the functional components are integrated on one chip, and other functional components are integrated on another chip or distributed independently, which is easy to realize.

In the figures: 1—preamplifier circuit, 2—matching circuit, 3—output stage amplifier circuit, 4—input matching circuit, 5—output matching circuit, 6—bias circuit, 7—switch group, 8—switchable capacitor array.

DETAILED DESCRIPTION OF THE INVENTION

The technical solution claimed in the present application will be further described in detail with reference to the drawings and specific embodiments.

According to the invention, different input load lines and output load lines can be selected according to different received RF frequencies to amplify and output the input RF signals, which solves the problems of large number of components, difficult integration and difficult design caused by many groups of power amplifiers for different frequencies. The structure of the power amplifier is shown in FIGS. 1-8.

Embodiment 1

Figure 1:
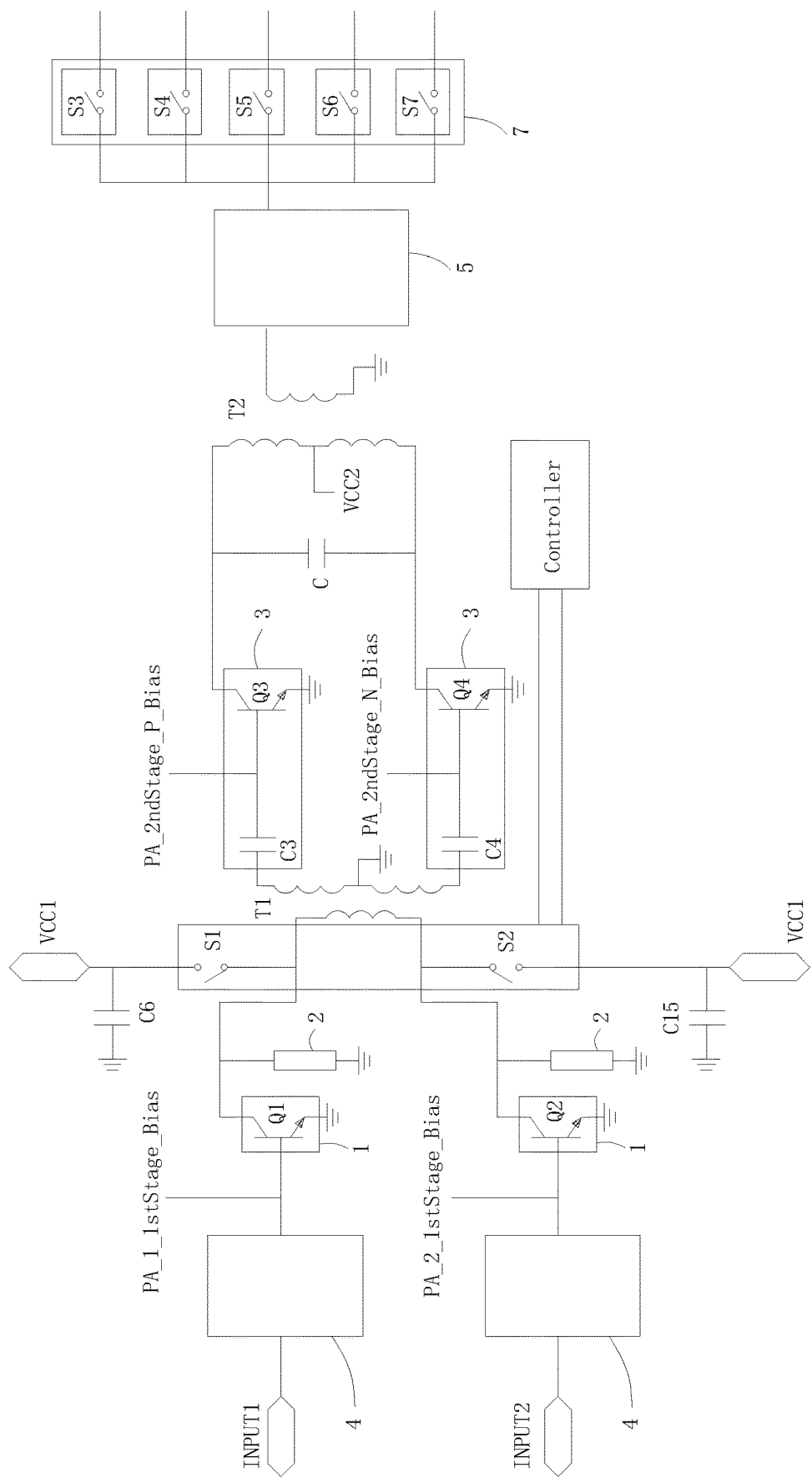
FIG. 1 is a circuit structure diagram of the power amplifier provided by the present invention.

As shown in FIG. 1, the dual-mode power amplifier with switchable operating frequencies provided by the present invention includes at least two preamplifier circuits 1, a matching circuit 2 for matching an output signal of each preamplifier circuit 1, an input transformer T1 with at least two output taps, an output stage amplifier circuit 3 with the same number as the output taps of input transformer T1, an output transformer T2 with the same number as the input taps of output stage amplifier circuit 3, a switch S1 and a switch S2, and the output end of each output stage amplifier circuit 3 is connected to an input tap of output transformer T2. Matching circuit 2 is connected between the output end of preamplifier circuit 1 and ground, and performs power matching on the signal output by preamplifier circuit 1. Circuit power supply VCC1 is loaded on the input end of input transformer T1 via switch S1 and switch S2 respectively. The operating frequency of each matching circuit 2 is different. According to the different signal frequencies received by preamplifier circuit 1, one preamplifier circuit is selected and turned on, and switch S1/switch S2 is turned on.

In addition, the dual-mode power amplifier provided in this embodiment further includes a capacitor C connected in series with the input end of output transformer T2.

Embodiment 2

Figure 2:
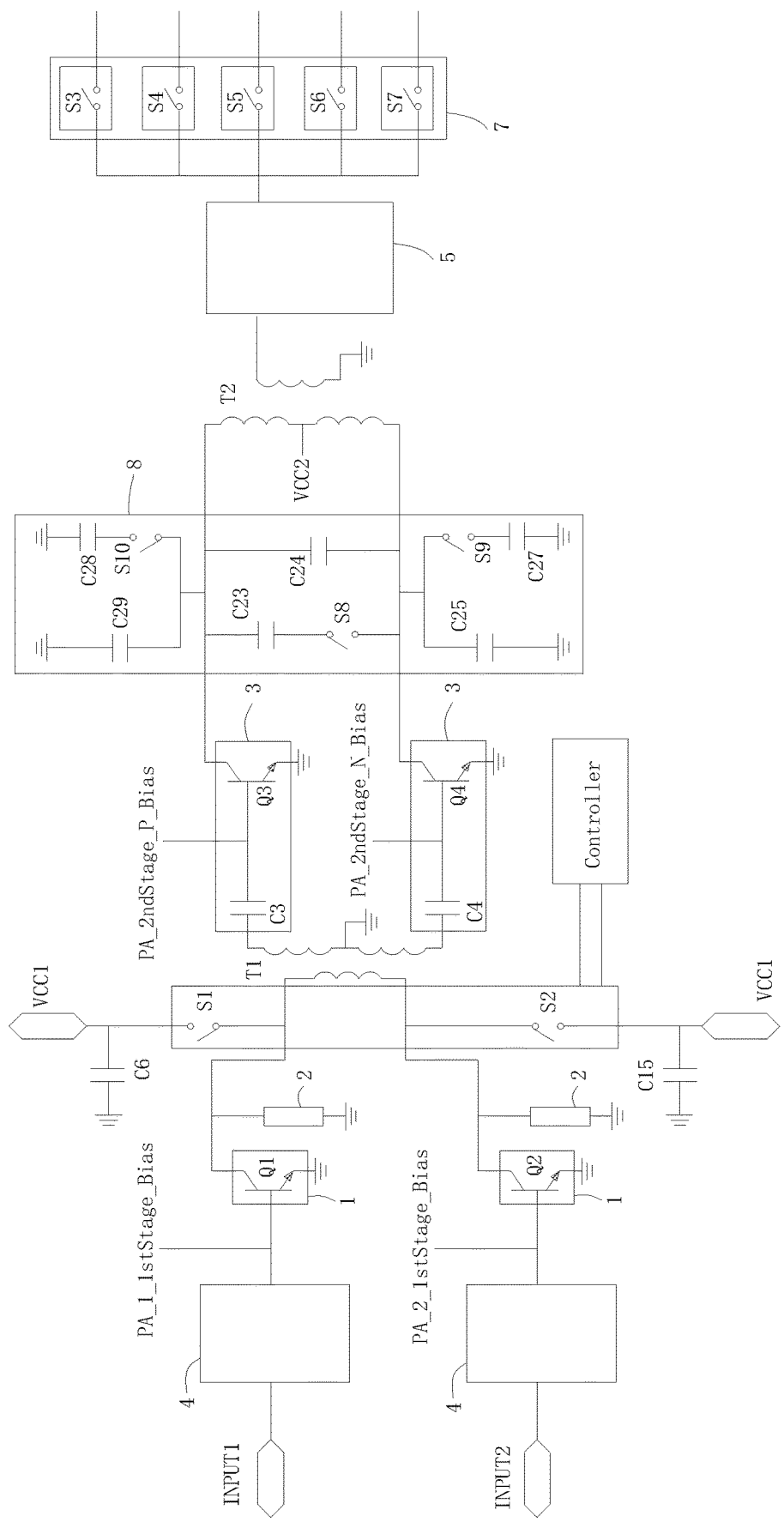
FIG. 2 is another circuit structure diagram of the power amplifier provided by the present invention.

As shown in FIG. 2, the dual-mode power amplifier with switchable operating frequencies provided by the present invention includes at least two preamplifier circuits 1, a matching circuit 2 for matching an output signal of each preamplifier circuit 1, an input transformer T1 with at least two output taps, an output stage amplifier circuit 3 with the same number as the output taps of input transformer T1, an output transformer T2 with the same number as the input taps of output stage amplifier circuit 3, a switch S1, a switch S2 and a switchable capacitor array 8. Matching circuit 2 is connected between the output end of preamplifier circuit 1 and ground, and performs power matching on the signal output by preamplifier circuit 1. Circuit power supply VCC1 is loaded on the input end of input transformer T1 via switch S1 and switch S2 respectively. The operating frequency of each matching circuit 2 is different. According to the different signal frequencies received by preamplifier circuit 1, one preamplifier circuit and one output stage amplifier circuit are selected and turned on, and switch S1/switch S2 is turned on.

Switchable capacitor array 8 is connected to the input end of output transformer T2 to establish a matched switchable capacitor array, and switchable capacitor array 8 includes an impedance element and a controllable switch element which is controlled to be turned on/off by an external control signal to form different impedances, and any existing matching circuit can be adopted. The present application includes capacitor C23, capacitor C24, capacitor C25, capacitor C27, capacitor C28, capacitor C29, switch S8, switch S9 and switch S10. Capacitor 23 and switch S8 are connected in series between the input ends of output transformer T2, and capacitor C24 is connected between the input ends of output transformer T2. Capacitor C27 and switch S9 are connected in series between the input end of output transformer T2 and ground, and this end of output transformer T2 is further grounded via capacitor C25; Capacitor C28 and switch S10 are connected in series between the other input end of output transformer T2 and ground, and this end of output transformer T2 is further grounded via capacitor C29.

A controllable switch of the power amplifier provided by the invention is a radio frequency switch, and is controlled to be on/off by an external signal, thereby realizing the reconstruction of matching circuit 2 and switchable capacitor array 8, forming different impedances, and realizing the switching of the output operating frequency band.

The preamplifier circuit 1 described in Embodiment 1 and Embodiment 2 may be any existing circuits or components capable of amplifying signals, the one adopted by the present invention is composed of triodes. For example, two preamplifier circuits, which are respectively composed of a power-amplifier tube Q1 and a power-amplifier tube Q2. The corresponding input transformer T1 includes two output taps, and each tap is connected with an output stage amplifier circuit 3.

The above-mentioned output stage amplifier circuit 3 may be any existing circuits or components capable of amplifying signals, and the one adopted by the present invention is composed of triodes and capacitors. An output stage amplifier circuit includes a capacitor C3 and a power-amplifier tube Q3. The first plate of capacitor C3 is connected with an output tap of input transformer T1, and the second plate is connected with the control end of power-amplifier tube Q3. The positive power supply end of power-amplifier tube Q3 is an output end connected to an input tap of output transformer T2, and the negative power supply end of power-amplifier tube Q3 is grounded. The other output stage amplifier circuit includes capacitor C4 and power-amplifier tube Q4. The first plate of capacitor C4 is connected with the other output tap of input transformer T1, and the second plate is connected with the control end of power-amplifier tube Q4. The positive power supply end of power-amplifier tube Q4 is an output end connected to the other input tap of output transformer T2, and the negative power supply end is grounded.

Figure 6:
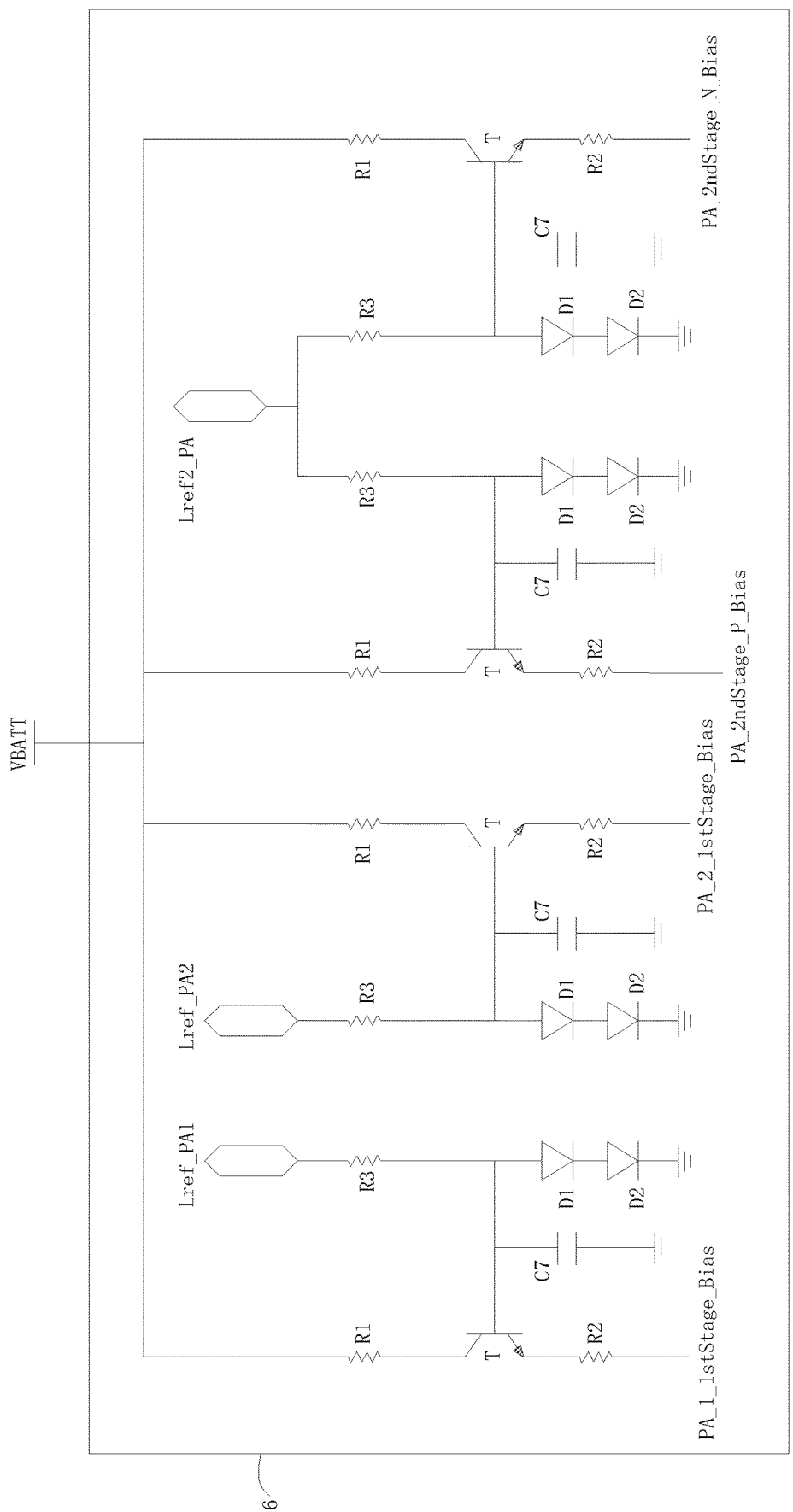
FIG. 6 is a schematic circuit diagram of the bias circuit described in the present invention.

The power-amplifier tubes Q1, Q2, Q3 and Q4 described in the present invention may be field effect transistors or triode transistors. Turn-on and turn-off of power-amplifier tubes Q1, Q2, Q3 and Q4 are controlled by control signals which can be generated by any circuits. In the present application, bias circuits are adopted to control turn-on and turn-off of power-amplifier tubes Q1, Q2, Q3 and Q4. The bias circuit may be any of the existing bias circuits. The schematic circuit diagram of the bias circuit 6 is shown in FIG. 6, which includes bias branches with the same number as the power-amplifier tubes. Each bias branch includes an output end, and the output control signal is loaded on the control ends of power-amplifier tubes Q1, Q2, Q3 and Q4. Each bias branch includes a switch transistor T, a resistor R1, a resistor R2, a resistor R3, a capacitor C7, a diode D1 and a diode D2, wherein the power supply end of switch transistor T is connected with an external control signal (such as a power supply) via resistor R1, and resistor R2 is connected with the output end of switch transistor T. The control end of switch transistor T is grounded via capacitor C7, and is also connected to the anode of diode D1, the cathode of diode D1 is connected to the anode of diode D2, and the cathode of diode D2 is grounded. The control end of switch transistor T is also connected with an external control signal via resistor R3. Switch transistor T may be a triode transistor or a field effect transistor.

The output stage amplifier circuits described in the present invention are turned on in different modes. According to the different signal frequencies received by the preamplifier circuit, one preamplifier circuit is selected to be turned on, and then switch S1 or switch S2 is turned on, thereby realizing the maximum output of the operating frequency. Two groups of preamplifiers are used to amplify signals in different frequency bands. When power-amplifier tube Q1 works, switch S1 is turned off and switch S2 is turned on. When power-amplifier tube Q2 works, switch S2 is turned off and switch S1 is turned on.

Figure 7:
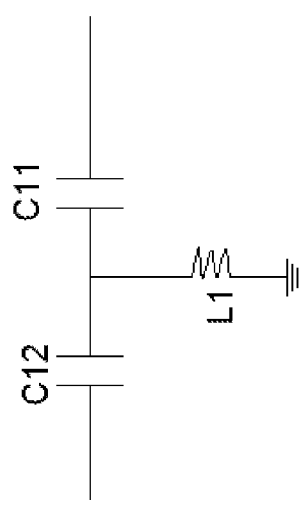
FIG. 7 is a schematic circuit diagram of the input matching circuit described in the present invention.
Figure 8:
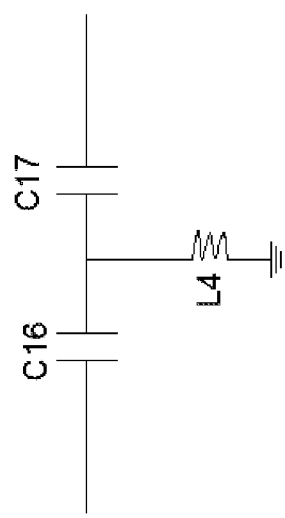
FIG. 8 is another schematic circuit diagram of the input matching circuit described in the present invention.

In order to ensure the stability of the signal loaded on preamplifier circuit 1, the power amplifier further includes an input matching circuit 4 for filtering the signal to be amplified, and input matching circuit 4 is connected with the input end of preamplifier circuit 1. It may be any of the existing capacitance filter circuit, inductance filter circuit, RC filter circuit and LC filter circuit. As shown in FIGS. 7 and 8 respectively, the present application adopts an input matching circuit 4 composed of a capacitor C12, a capacitor C11, and an inductor L1, and connected to the input of a preamplifier circuit composed of power-amplifier tube Q1; and an input matching circuit 4 composed of a capacitor C16, a capacitor C17, and an inductor L4, and connected to the input of a preamplifier circuit composed of a power-amplifier tube Q4. The first plate of capacitor C12 and the first plate of capacitor C16 are used as input ends for loading signals, and the second plate of capacitor C12 and the second plate of capacitor C16 are connected to the control ends of power-amplifier tube Q1 and power-amplifier tube Q2 via capacitor C11 and capacitor C17 respectively. The second plate of capacitor C12 is further grounded via inductor L1, and the second plate of capacitor C16 is further grounded via inductor L4.

To obtain the bandwidth and harmonic suppression required by the power amplifier, the power amplifier further includes an output matching circuit 5 for filtering the signal output by output transformer T2. The output matching circuit 5 may be anyone of the existing low-pass filter circuit composed of capacitors and inductors, or high-pass & low-pass circuit composed of capacitors and inductors, or low-pass trap circuit composed of capacitors and inductors, or high-pass & low-pass trap circuit composed of capacitors and inductors.

In order to better select an output load line to drive the specific load, the power amplifier provided by the present invention also includes a switch group 7 composed of at least two switches. Switch group 7 is connected with the output end of the output matching circuit, and each switch independently constitutes an output for outputting signals. The switch groups may consist of 4, 6, 8 or other numbers of switches. In the present application, the switches S3~S8 are used, and each switch is used as one output, and its on-off is controlled by an external control signal.

Figure 3:
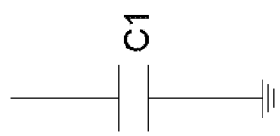
FIG. 3 is a schematic circuit diagram of the matching circuit described in the present invention.
Figure 4:
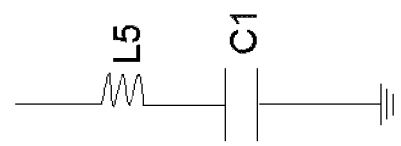
FIG. 4 is another schematic circuit diagram of the matching circuit described in the present invention.
Figure 5:
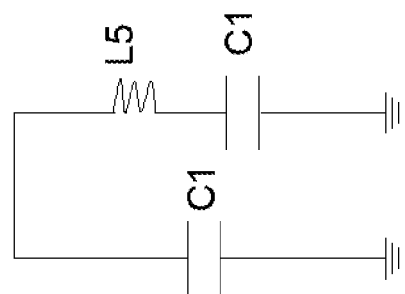
FIG. 5 is another schematic circuit diagram of the matching circuit described in the present invention.

Matching circuit 2 described in the present invention may be anyone of the following circuits:
1) As shown in FIG. 3, it includes an independent capacitor C1, which is connected between the output end of the preamplifier circuit and ground.
2) As shown in FIG. 4, it includes a capacitor C1 and an inductor L5, which are connected in series between the output end of the preamplifier circuit and ground.
3) As shown in FIG. 5, it includes a capacitor C1, a capacitor C2 and an inductor L5, wherein capacitor C1 is connected between the output end of the preamplifier circuit and ground, and capacitor C2 and inductor L5 are connected in series between the output end of the preamplifier circuit and ground.

In order to make circuit power supply VCC1 stably loaded on the input end of input transformer T1, the end of switch S1 and/or switch S2 connected to circuit power supply VCC1 is further grounded via capacitor C6/capacitor C15; capacitor C6 and capacitor C15 are arranged beside circuit power supply VCC1, so it acts as a decoupling capacitor, which can not only provide a stable power supply, but also reduce the noise of components coupled to the input end of input transformer T1, thus reducing the influence of the noise of the input transformer on other components and ensuring the stability of the circuit.

The distribution modes of preamplifier circuit 1, matching circuit 2, input transformer T1, output stage amplifier circuit 3, output transformer T2, switch S1, switch S2, input matching circuit 4, bias circuit 6, output matching circuit 5, switch group 7 and switchable capacitor array 8 described in this application can be one of the followings or others:

1. Premplifier circuit 1, matching circuit 2, input transformer T1, output stage amplifier circuit 3, output transformer T2, switch S1, switch S2, input matching circuit 4, output matching circuit 5, bias circuit 6, switch group 7 and switchable capacitor array 8 can be integrated on one chip by HBT/SOI/CMOS/PHEMT/BIHEMT/SiGe or other processes to form a power amplifier chip;
2. Preamplifier circuit 1, matching circuit 2, input transformer T1, output stage amplifier circuit 3, output transformer T2, switch S1, switch S2, input matching circuit 4 and bias circuit 6 can be integrated on one chip by HBT/SOI/CMOS/PHEMT/BIHEMT/SiGe or other processes to form a power amplifier chip. Output matching circuit 5, switch group 7 and switchable capacitor array 8 serve as peripheral circuits of the power amplifier chip and are arranged on the periphery of the power amplifier chip and connected by wires;

3. Preamplifier circuit 1, matching circuit 2, input transformer T1, output stage amplifier circuit 3, output transformer T2, switch S1, switch S2, input matching circuit 4 and bias circuit 6 can be integrated on one chip by HBT/SOI/CMOS/PHEMT/BIHEMT/SiGe or other processes to form a power amplifier chip. Output matching circuit 5, switch group 7 and switchable capacitor array 8 can be integrated on another chip by HBT/SOI/CMOS/PHEMT/BIHEMT/SiGe or other processes to form a switch chip, and the power amplifier chip and the switch chip are connected by wires;

4. Preamplifier circuit 1, matching circuit 2, input transformer T1, output stage amplifier circuit 3, input matching circuit 4, bias circuit 6 and switchable capacitor array 8 can be integrated on one chip by HBT/SOI/CMOS/PHEMT/BIHEMT/SiGe or other processes to form a power amplifier chip; switch S1, switch S2 and switch group 7 are integrated on one chip to form a switch chip, and the power amplifier chip and the switch chip are connected by wires; output transformer T2 and output matching circuit 5 are independently distributed on the peripheries of the power amplifier chip and the switch chip and are connected by wires;

5. Preamplifier circuit 1, matching circuit 2, input transformer T1, output stage amplifier circuit 3, input matching circuit 4, bias circuit 6 and switchable capacitor array 8 can be integrated on one chip by HBT/SOI/CMOS/PHEMT/BIHEMT/SiGe or other processes to form a power amplifier chip; switch S1 and switch S2 are integrated on one chip to form a switch chip, and the power amplifier chip and the switch chip are connected by wires; output transformer T2, output matching circuit 5 and switch group 7 are independently distributed on the peripheries of the power amplifier chip and the switch chip and are connected by wires;

6. Preamplifier circuit 1, matching circuit 2, input transformer T1, output stage amplifier circuit 3, input matching circuit 4, output matching circuit 5, bias circuit 6 and switchable capacitor array 8 can be integrated on one chip by HBT/SOI/CMOS/PHEMT/BIHEMT/SiGe or other processes to form a power amplifier chip; switch S1, switch S2 and switch group 7 are integrated on one chip to form a switch chip, and the power amplifier chip and the switch chip are connected by wires;

7. Preamplifier circuit 1, matching circuit 2, input transformer T1, output transformer T2, output stage amplifier circuit 3, input matching circuit 4, output matching circuit 5, bias circuit 6 and switchable capacitor array 8 can be integrated on one chip by HBT/SOI/CMOS/PHEMT/BIHEMT/SiGe or other processes to form a power amplifier chip; switch S1 and switch S2 are integrated on one chip to form a switch chip, and the power amplifier chip and the switch chip are connected by wires; switch group 7 is distributed on peripheries of the power amplifier chip and the switch chip as an independent switch group, and connected by wires.

In the present application, input transformer T1 and output transformer T2 may be any types of the existing transformers. A balanced-unbalanced transformer (Balun) is used in the present application.

The above embodiments are only used to illustrate the technical solution of the present application, not intended to limit it. Modifications or equivalent substitutions made by those skilled in the art, which do not deviate from the spirit or scope of the present application, shall be included in the protection scope of the claims.

What is claimed is:

1. A dual-mode power amplifier with switchable operating frequencies, comprising at least two preamplifier circuits, a matching circuit for matching an output signal of each preamplifier circuit, an input transformer T1 with at least two output taps, an output stage amplifier circuit with the same number as the output taps of the input transformer T1, an output transformer T2, a switch S1 and a switch S2, and a circuit power supply VCC1 is loaded on an input end of the input transformer T1 via the switch S1 and the switch S2 respectively; operating frequencies of the matching circuit are different.

2. The dual-mode power amplifier with switchable operating frequencies of claim 1, wherein the matching circuit comprises a capacitor C1 connected between an output end of the preamplifier circuit and ground.

3. The dual-mode power amplifier with switchable operating frequencies of claim 1, wherein the matching circuit comprises a capacitor C1 and an inductor L5 connected in series between an output end of the preamplifier circuit and ground.

4. The dual-mode power amplifier with switchable operating frequencies of claim 1, wherein the matching circuit comprises a capacitor C1, a capacitor C2 and an inductor L5; the capacitor C1 is connected between an output end of the preamplifier circuit and ground, and the capacitor C2 and the inductor L5 are connected in series between an output end of the preamplifier circuit and ground.

5. The dual-mode power amplifier with switchable operating frequencies of claim 1, wherein one end of the switch S1 and/or the switch S2 connected to the circuit power supply VCC1 is further grounded via a capacitor C6/a capacitor C15.

6. The dual-mode power amplifier with switchable operating frequencies of claim 5, further comprising an input matching circuit for performing input matching on a signal loaded on an input end of each preamplifier circuit.

7. The dual-mode power amplifier with switchable operating frequencies of claim 6, further comprising an output matching circuit for performing output matching on an output signal of the output transformer T2.

8. The dual-mode power amplifier with switchable operating frequencies of claim 7, further comprising a switch group composed of at least two switches connected with an output end of the output matching circuit, and each switch is an independent output for outputting signals.

9. The dual-mode power amplifier with switchable operating frequencies of claim 8, further comprising a switchable capacitor array, the switchable capacitor array is connected to an input end of the output transformer T2 to establish matching; and the switchable capacitor array comprises an impedance element and a controllable switch element whose on/off is controlled by an external control signal to form different impedances.

10. The dual-mode power amplifier with switchable operating frequencies of claim 9, wherein the preamplifier circuit and the output stage amplifier circuit are controlled to be turned on/off by a bias circuit.

11. The dual-mode power amplifier with switchable operating frequencies of claim 10, wherein one or more of the preamplifier circuit, the matching circuit, the input transformer T1, the output stage amplifier circuit, the output transformer T2, the switch S1, the switch S2, the input matching circuit, the bias circuit, the output matching circuit and the switchable capacitor array are integrated on one chip, and other circuits are integrated on another chip or distributed independently.

* * * * *